(12) United States Patent
Fukuda et al.

(10) Patent No.: US 10,346,125 B2
(45) Date of Patent: Jul. 9, 2019

(54) DETECTION OF CLIPPING EVENT IN AUDIO SIGNALS

(71) Applicant: INTERNATIONAL BUSINESS MACHINES CORPORATION, Armonk, NY (US)

(72) Inventors: Takashi Fukuda, Tokyo (JP); Osamu Ichikawa, Tokyo (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 13 days.

(21) Appl. No.: 14/829,482

(22) Filed: Aug. 18, 2015

(65) Prior Publication Data

US 2017/0052758 A1    Feb. 23, 2017

(51) Int. Cl.
    *G06F 17/00*    (2019.01)
    *G06F 3/16*     (2006.01)
    *H03G 3/00*     (2006.01)
    *H03G 11/00*    (2006.01)
    *G10L 21/02*    (2013.01)

(52) U.S. Cl.
    CPC .............. *G06F 3/165* (2013.01); *G10L 21/02* (2013.01); *H03G 3/002* (2013.01); *H03G 11/00* (2013.01)

(58) Field of Classification Search
    CPC ..... G10L 21/02; H03F 2200/66; H03G 3/002; H03G 7/007
    See application file for complete search history.

(56) References Cited

U.S. PATENT DOCUMENTS

| 5,109,417 A | * | 4/1992 | Fielder | G06T 9/005 |
| | | | | 375/240 |
| 6,005,894 A | * | 12/1999 | Kumar | H03C 5/00 |
| | | | | 329/357 |

(Continued)

FOREIGN PATENT DOCUMENTS

CN    101897118    11/2010

OTHER PUBLICATIONS

Audrey Barinov, Voice Samples Recording and Speech Quality Assessment for Forensic and Automatic Speaker Identification, Nov. 4-7, 2010, Audio Engineering Society 129th Convention.*

(Continued)

*Primary Examiner* — Thomas H Maung
(74) *Attorney, Agent, or Firm* — Tutunjian & Bitetto, P.C.; Vazken Alexanian

(57) ABSTRACT

A method, a system, and a computer program product detect a clipping event in audio signals. The method includes digitalizing audio signals having limited frequency bands, at a sampling frequency which is greater than two times as large as the maximum frequency component of the audio signal; and detecting a clipping event of the audio signals, based on magnitudes of spectrum in a bandwidth which is greater than or equal to the limited frequency band. The sampling frequency may be greater than or equal to three times as large as the maximum frequency component of the audio signal. The detection of a clipping event may include determining, for each frame, whether or not a sum or average of the magnitudes of spectrum at the bandwidth which is greater than or equal to the limited frequency band is larger than a predetermined threshold.

18 Claims, 5 Drawing Sheets

(56) References Cited

U.S. PATENT DOCUMENTS

| | | | |
|---|---|---|---|
| 7,439,897 B1* | 10/2008 | Gorin | H03M 1/0629 |
| | | | 341/123 |
| 7,590,251 B2 | 9/2009 | Andersen et al. | |
| 8,712,066 B1 | 4/2014 | Baker et al. | |
| 2010/0128882 A1* | 5/2010 | Yamabe | G10L 21/0208 |
| | | | 381/71.1 |
| 2012/0136659 A1 | 5/2012 | Kang et al. | |
| 2014/0226829 A1 | 8/2014 | Skoglund et al. | |
| 2014/0229170 A1* | 8/2014 | Atti, Sr. | G10L 21/0264 |
| | | | 704/225 |

OTHER PUBLICATIONS

Michael Cerna and Audrey F. Harvey, The Fundamentals of FFT-Based Signal Analysis and Measurement, Jul. 2000, National Instruments, Application Note 041.*

Aleinik, et al., "Detection of Clipped Fragments in Speech Signals", World Academy of Science, Engineering and Technology International Journal of Electrical, Computer, Electronics and Communication Engineering, Jan. 2014, vol. 8, No. 2, 7 pages.

Deng, et al., Clipping Detection of Audio Signals Based on Kernel Fisher Discriminant, Signal and Information Processing (ChinaSIP), 2013 IEEE China Summit & International Conference, Jul. 2013, pp. 99-103.

* cited by examiner

DETECTION OF CLIPPING EVENT IN AUDIO SIGNALS

BACKGROUND

This invention relates to a clipping detection and, more especially, to a detection of a clipping event in audio signals.

In an audio recording, clipping events occur when an amplitude of an input signal to an audio recording device has exceeded an available dynamic range of the audio recording device.

The clipping events occur in, for example, voice telecommunications. The clipping events in the waveform during the audio recording degrade speech recognition performance. This is because the clipping events unintentionally appear in a high-frequency area of spectrum.

Typically, the clipping events can be detected by checking whether or not each sample of waveform is reached at maximum or minimum value. For example, in 16-bit quantization, the maximum and minimum values of the sample in the waveform are +32,768 and −32,767, respectively.

Values in which the clipping events occur are not necessarily maximum or minimum values of the 16-bit quantization, depending on the condition of an audio recording device or software.

SUMMARY

According to one aspect of the present invention, an embodiment of the present invention provides a computer-implemented method for detecting a clipping event in audio signals. The method comprises digitalizing audio signals having limited frequency bands, at a sampling frequency which is greater than two times as large as the maximum frequency component of the audio signal; and detecting a clipping event of the audio signals, based on magnitudes of spectrum in a bandwidth which is greater than or equal to the limited frequency band.

According to another aspect of the present invention, a system such as a computer system comprising a computer readable storage medium storing a program of instructions executable by the system to perform one or more methods described herein may be provided.

According to another aspect of the present invention, a computer program product comprising a computer readable storage medium storing a program of instructions executable by the system to perform one or more methods described herein also may be provided.

DETAILED DESCRIPTION

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Figure 1:
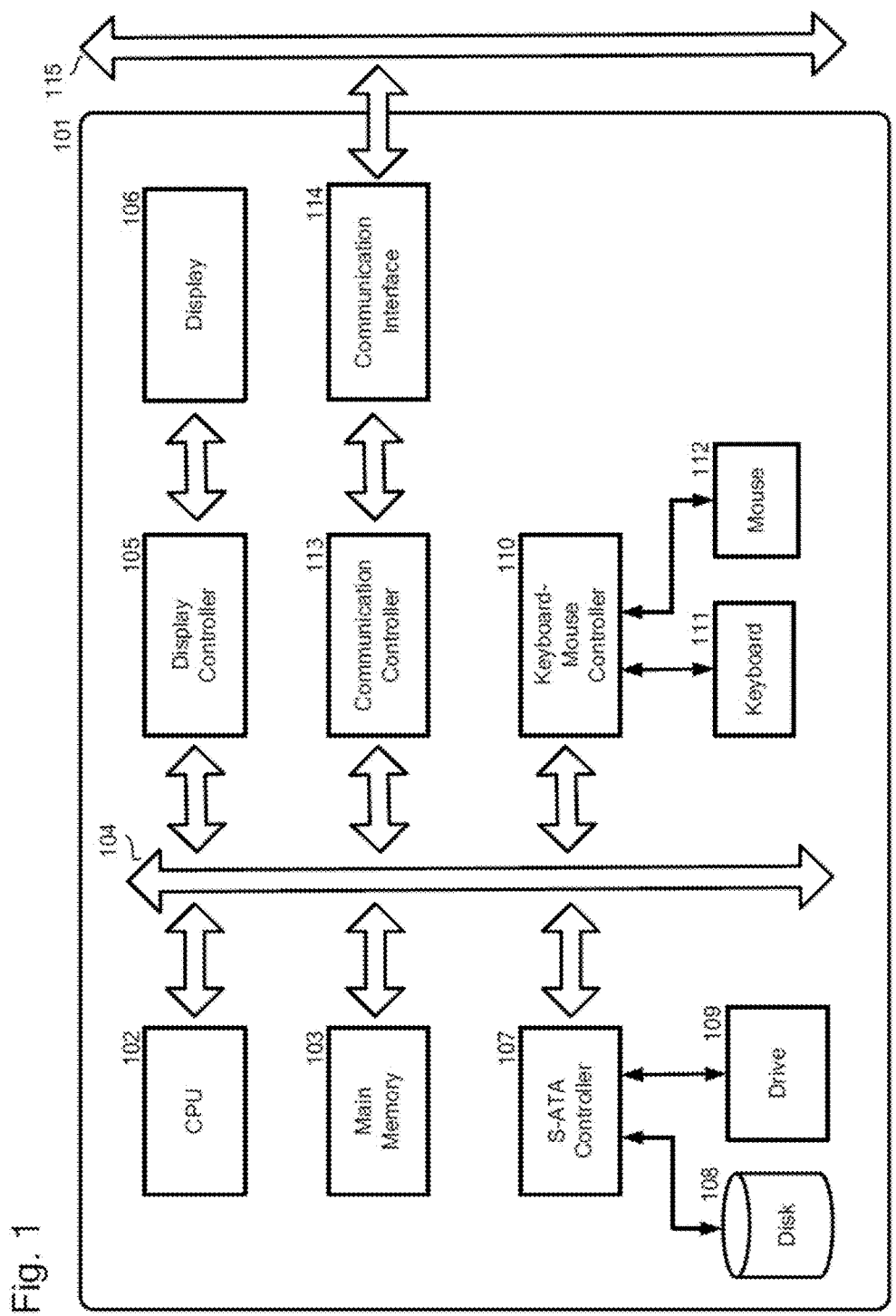
FIG. 1 illustrates an example of a basic block diagram of a computer hardware used in an embodiment of the present invention.

With reference now to FIG. 1, FIG. 1 illustrates an exemplified basic block diagram of a computer hardware used in an embodiment of the present invention.

A computer (101) may be, for example, but is not limited to, a desktop, a laptop, a notebook, a tablet or a server computer. The server computer may be, for example, but is not limited to, a workstation, a rack-mount type server, a blade type server, or a mainframe server and may run, for example, a hypervisor for creating and running one or more virtual machines. The computer (101) may comprise one or more CPUs (102) and a main memory (103) connected to a bus (104). The CPU (102) may be preferably based on a 32-bit or 64-bit architecture. The CPU (102) may be, for example, but is not limited to, the Power® series of International Business Machines Corporation; the Core i™ series, the Core 2™ series, the Atom™ series, the Xeon™ series, the Pentium® series, or the Celeron® series of Intel Corporation; or the Phenom™ series, the Athlon™ series, the Turion™ series, or Sempron™ of Advanced Micro Devices, Inc. ("Power" is registered trademark of International Business Machines Corporation in the United States, other countries, or both; "Core i", "Core 2", "Atom", and "Xeon" are trademarks, and "Pentium" and "Celeron" are registered trademarks of Intel Corporation in the United States, other countries, or both; "Phenom", "Athlon", "Turion", and "Sempron" are registered trademarks of Advanced Micro Devices, Inc. in the United States, other countries, or both).

A display (106) such as a liquid crystal display (LCD) may be connected to the bus (104) via a display controller (105). The display (106) may be used to display, for management of the computer(s), information on a computer connected to a network via a communication line and information on software running on the computer using an appropriate graphics interface. A disk (108) such as a hard disk or a solid state drive, SSD, and a drive (109) such as a CD, a DVD, or a BD (Blu-ray disk) drive may be connected to the bus (104) via an SATA or IDE controller (107). Moreover, a keyboard (111) and a mouse (112) may be connected to the bus (104) via a keyboard-mouse controller (110) or USB bus (not shown).

An operating system, programs providing Windows®, UNIX® Mac OS®, Linux®, or a Java® processing environment, Java® applications, a Java® virtual machine (VM), and a Java® just-in-time (JIT) compiler, such as J2EE®, other programs, and any data may be stored in the disk (108) to be loadable to the main memory. ("Windows" is a registered trademark of Microsoft corporation in the United States, other countries, or both; "UNIX" is a registered trademark of the Open Group in the United States, other countries, or both; "Mac OS" is a registered trademark of Apple Inc. in the United States, other countries, or both; "Linux" is a registered trademark of Linus Torvalds in the United States, other countries, or both; and "Java" and "J2EE" are registered trademarks of Oracle America, Inc. in the United States, other countries, or both).

The drive (109) may be used to install a program, such as the computer program of an embodiment of the present invention, readable from a CD-ROM, a DVD-ROM, or a BD to the disk (108) or to load any data readable from a CD-ROM, a DVD-ROM, or a BD into the main memory (103) or the disk (108), if necessary.

A communication interface (114) may be based on, for example, but is not limited to, the Ethernet® protocol. The communication interface (114) may be connected to the bus (104) via a communication controller (113), physically connects the computer (101) to a communication line (115), and may provide a network interface layer to the TCP/IP communication protocol of a communication function of the operating system of the computer (101). In this case, the communication line (115) may be a wired LAN environment or a wireless LAN environment based on wireless LAN connectivity standards, for example, but is not limited to, IEEE® 802.11a/b/g/n ("IEEE" is a registered trademark of Institute of Electrical and Electronics Engineers, Inc. in the United States, other countries, or both).

Figure 2:
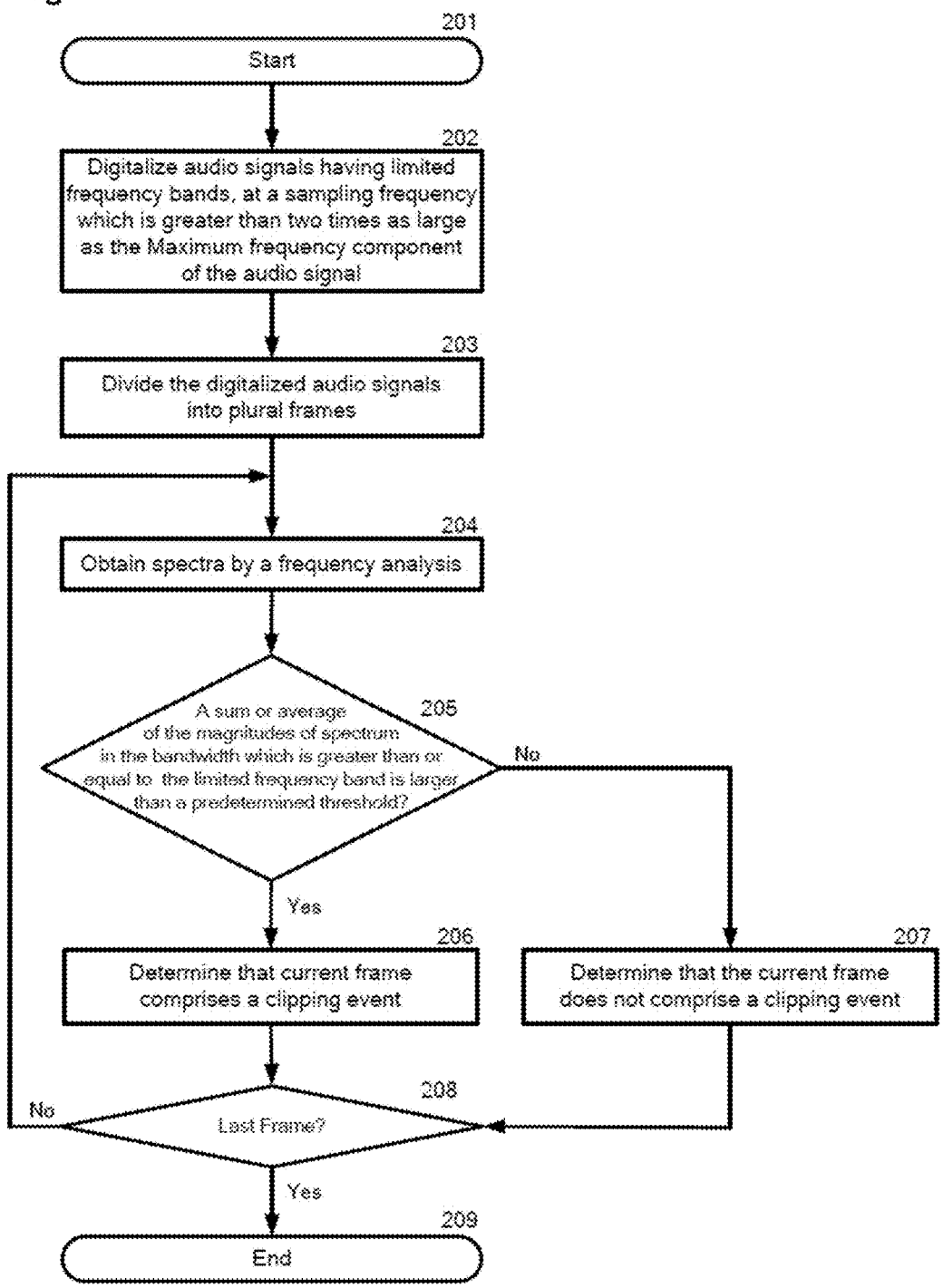
FIG. 2 illustrates one embodiment of a flowchart of a process for detecting clipping events in audio signals

With reference now to FIG. 2, FIG. 2 illustrates one embodiment of a flowchart of a process for detecting clipping events in audio signals.

A system such as the computer (101) performs the process described in FIG. 2. The system may be implemented as a single computer or plural computers.

In step 201, the system starts the process for detecting clipping events in audio signals.

In step 202, the system digitalizes audio signals having limited frequency bands, at a sampling frequency which is greater than two times as large as the maximum frequency component of the audio signal, i.e. original signal. Namely, the original signal, $f_{IN}$, is sampled with at least twice its frequency, $f_{SAMPLE} \geq 2 \times f_{IN}$.

The audio signals may be for example, but not limited to, speech signals, music signals, cry of animals, sound of nature, an analogue sound recorded on magnetic tapes such as cassette tapes or video tapes, or a combination thereof. The speech signal may for example, but not limited to, comprise telephony data or conference data. The audio signals may be obtained from for example, but not limited to, a microphone or a medium for an analog sound recorder such as a cassette tape.

In one embodiment, the maximum frequency component of the audio signal may be for example, but not limited to, 4 kHz. For example, telephone networks have a message bandwidth of about 4 kHz.

In one embodiment, the sampling frequency may be greater than two times as large as the maximum frequency component of the audio signal. The sampling frequency may be greater or equal to 2.1 times as large as the maximum frequency component of the audio signal. In one embodiment, when the limited frequency band is 4 kHz, the sampling frequency is greater than 8 kHz (namely two times).

In another embodiment, the sampling frequency which is greater than two times as large as the maximum frequency component of the audio signal may be greater than or equal to three times as large as the maximum frequency component of the audio signal. In one embodiment, when the limited frequency band is 4 kHz, the sampling frequency is greater than or equal to 12 kHz (namely three times).

In another embodiment, the sampling frequency which is greater than two times as large as the maximum frequency component of the audio signal may be greater than or equal to four times as large as the maximum frequency component of the audio signal. In one embodiment, when the limited frequency band is 4 kHz, the sampling frequency is greater than 16 kHz.

In step 203, the system divides the digitalized audio signals into plural frames. Each frame may have length of for example, but not limited to, several tens of millisecs, such as 25 ms.

In step 204, the system takes one frame among the divided frames and, then, obtains a spectrum from the frame by a frequency analysis. The frequency analysis may be for example, but not limited to, the Fast Fourier Transform, the FFT.

In step 205, the system judges whether or not a sum or average of the magnitudes of spectrum, a(t), in the bandwidth which is greater than or equal to the limited frequency band is larger than a predetermined threshold, η. In one embodiment, the predefined threshold may be set by preparing samples comprising cases where clipping events occurred and cases where clipping events did not occur, and decides a threshold by which the samples are correctly divided for the cases where clipping events occurred and the cases where clipping events did not occur. In another embodiment, if the samples comprising cases where clipping events occurred cannot be prepared in advance, the predefined threshold may be set, using the samples comprising only cases where clipping events did not occur. The numerals of the predefined threshold may depend on an environment at which audio signals are recorded.

In one embodiment, for example, the following equation (1) may be used for calculating the sum of the magnitudes of spectrum, a(t), depending on the max frequency of an original signal and the sampling frequency:

$$a(t) = \sum_{\substack{f \in nk \\ -mkHz}} x(t, f) \qquad (1)$$

where x(t, f) denotes log power spectrum; t denotes time; and f denotes frequency bin; n denotes the max frequency of an original signal, n>0; m denotes a half of the sampling frequency, m>0; and m>n.

In another embodiment, for example, the following equation (2) may be used for calculating the average of the magnitudes of spectrum, a(t) depending on the max frequency of an original signal and the sampling frequency:

$$a(t) = \left\{ \sum_{\substack{f \in nk \\ -mkHz}} x(t, f) \right\} / b_f \qquad (2)$$

If the max frequency of an original signal is 4 kHz, n in the equations (1) and (2) is 4. Further, if the sampling frequency is 12 kHz, m in the equations (1) and (2) is 6. Accordingly, the range of f∈n k~m kHz in the equations (1) and (2) is defined as f∈4 k~6 kHz.

If the max frequency of an original signal is 4 kHz, n in the equations (1) and (2) is 4. Further, if the sampling frequency is 16 kHz, m in the equations (1) and (2) is 8. Accordingly, the range of f∈n k~m kHz in the equations (1) and (2) is defined as f∈4 k~8 kHz.

The frequency bin can be computed with reference to a data converter's sampling period: $Bin = f_{SAMPLE} / N_{RECORD} = 1/(N_{RECORD} \times \Delta t_{SAMPLE})$ where $f_{SAMPLE}$ denotes a sampling frequency of an analog-to-digital converters:

$N_{RECORD}$ denotes the number of signal points captured in the time domain; $\Delta t_{SAMPLE}$ denotes a time interval in each of signal points; the number of frequency points or lines or bands in the power spectrum is $N_{RECORD}/2$; and the first frequency line in the power spectrum always represents DC (frequency=0); the last frequency line can be found at $f_{SAMPLE}/2-f_{SAMPLE}/N_{RECORD}$, and frequency lines are spaced at even intervals of $f_{SAMPLE}/N_{RECORD}$, commonly referred to as frequency or FFT bins. For example, if the sampling frequency is 16 kHz, $\Delta t_{SAMPLE}$ is 1/16000.

If the determination is positive, the system proceeds with a step 206. On the other hand, if the determination is negative, the system proceeds with a step 207.

In step 206, the system determines that the current frame is to be clipped as a clipping event. In the both equations (1) an (2) above, if $a(t)>\eta$, the system determines that the current frame is to be clipped as a clipping event; otherwise, the system determines that the current frame is not to be clipped as a clipping event.

In step 207, the system determines that the current frame is not to be clipped as a clipping event. In the both equations of the above, if $a(t) \leq \eta$, the system determines that the current frame is not to be clipped as a clipping event.

In step 208, the system judges whether or not the processed frame is a last frame. If the determination is positive, the system proceeds with a step 209. On the other hand, if the determination is negative, the system returns to the step 204 to repeat the steps 204 to 208.

In step 209, the system terminates the process for detecting clipping events in audio signals.

The clipping events detection according to one embodiment of the present invention can avoid the degradation of the speech recognition performance caused by the clipping events. The clipping events detection according to one embodiment of the present invention can be used, for example, in speech recognition systems and speech processing applications.

Figure 3:
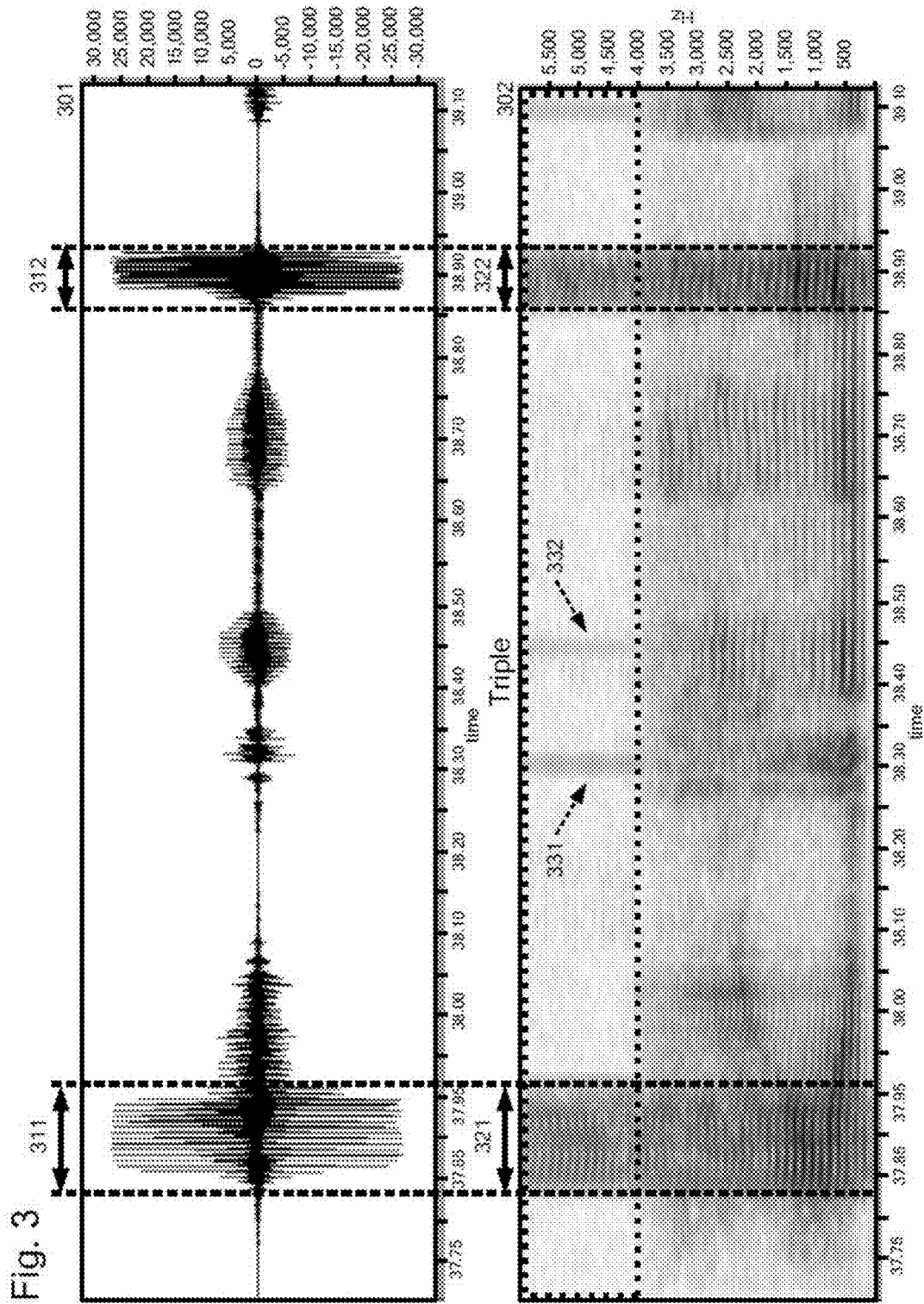
FIG. 3 illustrates one embodiment of digitalized waveform of a band limited 4 kHz signal with clipping events and a spectrum of the signal with a 12 kHz sampling frequency.
Figure 4:
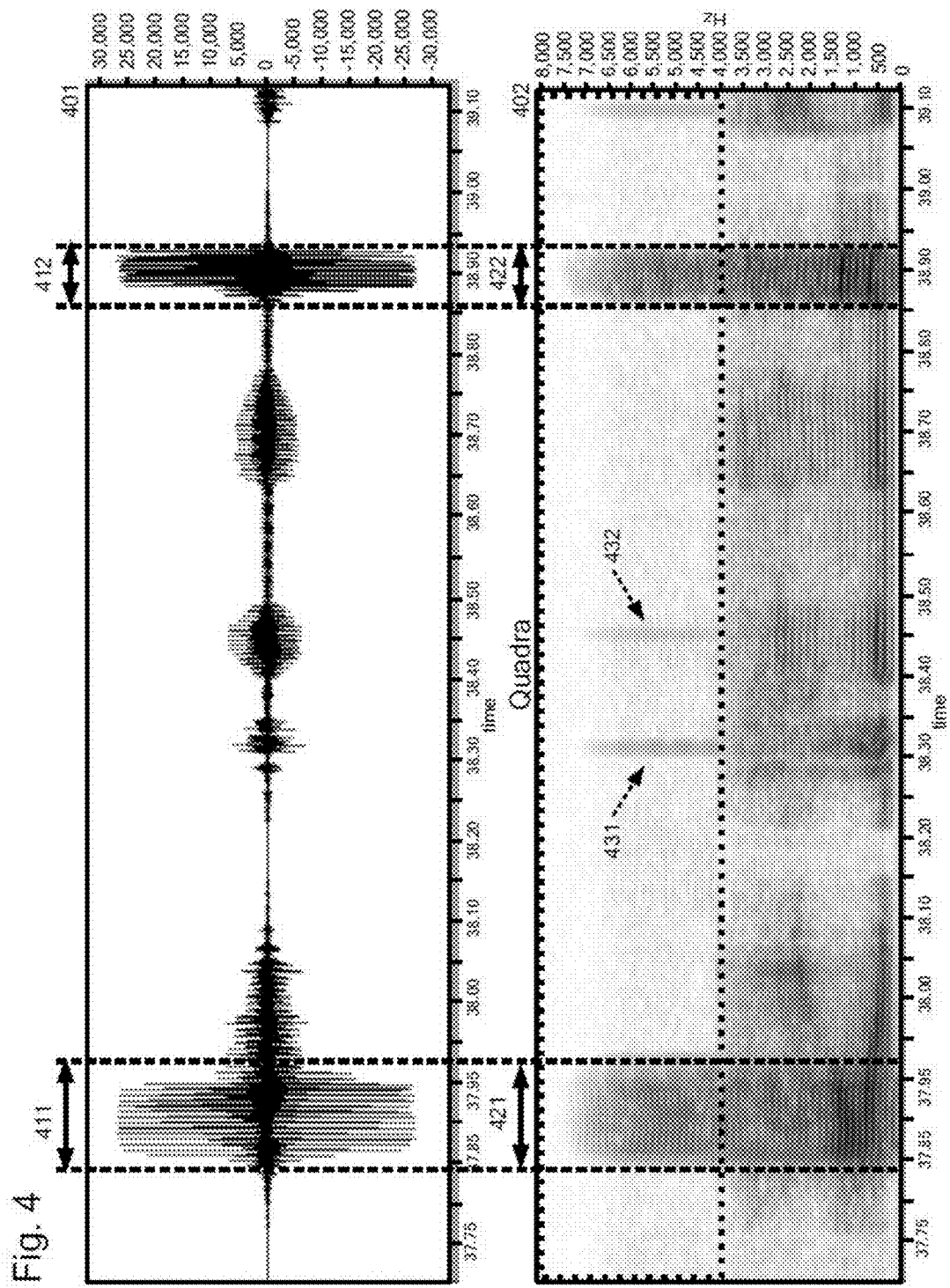
FIG. 4 illustrates one embodiment of digitalized waveform of a band limited 4 kHz signal with clipping events and a spectrum of the signal with a 16 kHz sampling frequency.

With reference now to FIGS. 3 and 4, FIGS. 3 and 4 illustrate embodiments of digitalized waveform of a band limited 4 kHz signal with clipping events and spectrums of the signal with a 12 kHz or a 16 kHz sampling frequency, respectively.

FIG. 3 illustrates the digitalized waveform of a band limited 4 kHz signal with clipping events and a spectrum of the signal with a 12 kHz sampling frequency.

The signal (301) was taken from the limited frequency bands of 4 kHz. The signal (301) shows that upper and lower limits are around +25,000 and -25,000, respectively, in this example. Further, the signal (301) shows that a level of the clipping events varies with time. Further, the signal (301) shows that the clipping events do not continuously occur, but locally appear when the power of input signal is largely changed.

The spectrum (302) was taken from digitalizing audio signals shown in the signal (301) with a 12 kHz sampling frequency, according to the step 202 described in FIG. 2. The spectrum (302) corresponds to the triple of the source signal.

The spectrum (302) shows that the clipping events shown in 321 and 322 appear above the 4,000 Hz.

Further, the spectrum (302) shows that spectrum components, shown in 331 and 332, by aliasing appear, but the magnitudes of these spectrum components (331 and 332) are much lower than the clipping events sections. Accordingly, these spectrum components (331 and 332) do not give harmful effects on the detection of the clipping event.

It is understandable that the parts shown in 311 and 312 in signals correspond to the clipping events.

In a case of the spectrum (302) where the sampling frequency is triple of the source signal, the detection accuracy of the clipping events is 100%.

FIG. 4 illustrates the digitalized waveform of a band limited 4 kHz signal with clipping events and a spectrum of the signal with a 16 kHz sampling frequency.

The signal (401) is the same as the signal (301) described in FIG. 3.

The spectrum (402) was taken from digitalizing audio signals shown in the signal (401) with a 16 kHz sampling frequency, according to the step 202 described in FIG. 2. The spectrum (402) corresponds to the quadruple of the source signal.

The spectrum (402) shows that the clipping events shown in 421 and 422 appear above the 4,000 Hz.

Further, the spectrum (402) shows that spectrum components, shown in 431 and 432, by aliasing appear, but the magnitudes of these spectrum components (431 and 432) are much lower than that of the clipping events sections. Accordingly, these spectrum components (431 and 432) do not give harmful effects on the detection of the clipping event.

It is understandable that the parts shown in 411 and 412 in signals correspond to the clipping events.

In a case of the spectrum (402) where the sampling frequency is quadruple of the source signal, the detection accuracy of the clipping events is 100%.

As seen in FIGS. 3 and 4, the clipping events are observable explicitly in the frequency range between 4 kHz to 8 kHz.

It is very hard to distinguish the clipping events from other frequency components when the double sampling frequency of source signal is used because only the frequency range in which the clipping events and the other components mix is used.

Figure 5:
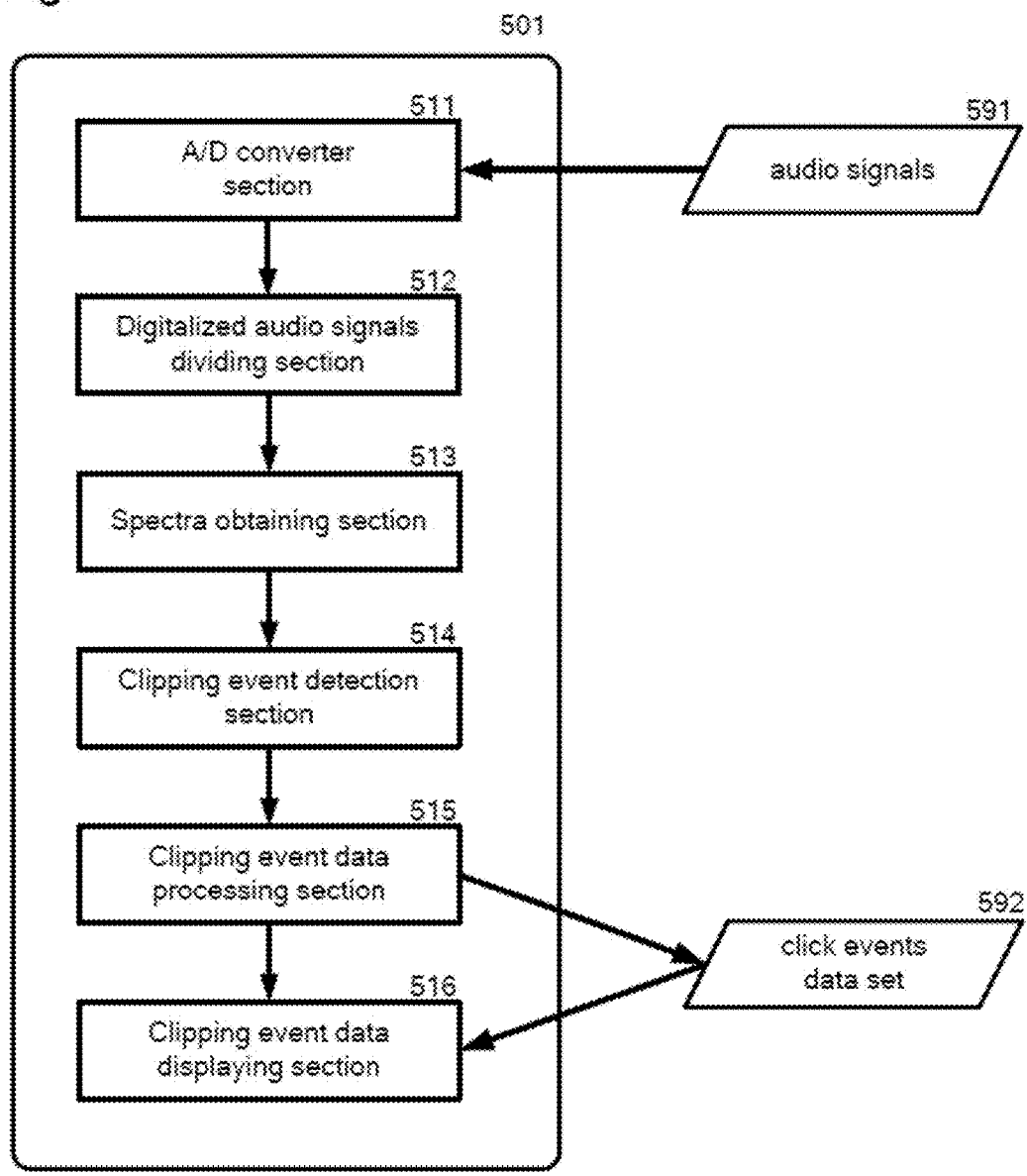
FIG. 5 illustrates one embodiment of an overall functional block diagram of a system hardware used in an embodiment of the present invention.

With reference now to FIG. 5, FIG. 5 illustrates one embodiment of an overall functional block diagram of a system hardware used in an embodiment of the present invention.

The system (501) corresponds to the computer (101) described in FIG. 1.

The system (501) comprises an A/D converter section (511), a digitalized audio signals dividing section (512), a spectra obtaining section (513), a clipping event detection section (514), a clipping event data processing section (515), and a clipping event data displaying section (516).

The A/D converter section (511) may digitalize audio signals (591) having limited frequency bands, at a sampling frequency which is greater than two times as large as the maximum frequency component of the audio signal.

The A/D converter section (511) may perform the step 202 described in FIG. 2.

The digitalized audio signals dividing section (512) may divide the digitalized audio signals into plural frames.

The digitalized audio signals dividing section (512) may perform the step 203 described in FIG. 2.

The spectra obtaining section (513) may obtain for each frame, spectra by a frequency analysis, such as Fast Fourier Transform.

The spectra obtaining section (513) may perform the steps from 204 to 208 described in FIG. 2.

The clipping event detection section (514) may detect a clipping event of the audio signals, based on magnitudes of spectrum in a bandwidth which is greater than or equal to the limited frequency band. The clipping event detection section (514) may determine, for each frame, whether or not a sum or average of the magnitudes of spectrum at the bandwidth which is greater than or equal to the limited frequency band is larger than a predetermined threshold. The clipping event detection section (514) may determine that the frame which is a subject of the determination comprises a clipping event, if the determination is positive.

The clipping event data processing section (515) may combine the clipping events detected by the clipping event detection section (514) to generate a clipping events data set (592).

The clipping event data displaying section (516) may display the clipping events data set (592) generated by the clipping event data processing section (515).

The present invention may be a method, a system, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

By the expression "a/one" should be understood as "at least one".

By the expression "comprise(s)/comprising a/one" should be understood as "comprise(s)/comprising at least one".

By the expression "comprise(s)/comprising" should be understood as "comprise(s)/comprising at least".

By the expression "/" should be understood as "and/or".

What is claimed is:

1. A computer-implemented method for detecting a clipping event in audio signals, the method comprising:
   digitalizing audio signals having limited frequency bands, at a sampling frequency which is greater than two times as large as the maximum frequency component of the audio signal;
   detecting a clipping event of the audio signals, based on magnitudes of spectrum in a bandwidth which is greater than or equal to the limited frequency band;
   dividing the digitalized audio signals into plural frames; and
   obtaining, for each frame, spectra by a frequency analysis,
   wherein the detection of a clipping event comprises detecting, for each frame, a clipping event of the audio signals, and a clipping event data set is constructed by combining one or more detected clipping events, a level of the clipping events varying over time responsive to a power level of the audio signal input, and
   wherein clipping occurs at a level between the maximum frequency component and half of the sampling frequency.

2. The method according to claim 1, wherein the sampling frequency is greater than or equal to three times as large as the maximum frequency component of the audio signal.

3. The method according to claim 1, wherein the sampling frequency is greater than or equal to four times as large as the maximum frequency component of the audio signal.

4. The method according to claim 1, wherein the detection of a clipping event comprises determining whether or not a sum or average of the magnitudes of spectrum at the bandwidth which is greater than or equal to the limited frequency band is larger than a predetermined threshold.

5. The method according to claim 1, wherein the detection of a clipping event comprises determining, for each frame, whether or not a sum or average of the magnitudes of spectrum at the bandwidth which is greater than or equal to the limited frequency band is larger than a predetermined threshold.

6. The method according to claim 5, wherein the detection of a clipping event comprises determining that the frame which is a subject of the determination comprises a clipping event, if the determination is positive.

7. The method according to claim 1, further comprising computing a frequency bin with reference to a sampling period of a data converter as follows:

$$\text{Bin} = f_{SAMPLE}/N_{RECORD} = 1/(N_{RECORD} \times \Delta t_{SAMPLE}),$$

where $f_{SAMPLE}$ denotes the sampling frequency; $N_{RECORD}$ denotes a number of signal points captured in a time domain; $\Delta t_{SAMPLE}$ denotes a time interval in each of a plurality of signal points; $N_{RECORD}/2$ denotes a number of frequency points or lines or bands in the spectrum; a first frequency line in the spectrum represents DC (frequency=0); a last frequency line can be found at $f_{SAMPLE}/2 - f_{SAMPLE}/N_{RECORD}$; and frequency lines are spaced at even intervals of $f_{SAMPLE}/N_{RECORD}$.

8. A system, comprising:
   a processor; and
   a memory storing a program, which, when executed on the processor, performs an operation for detecting a clipping event in audio signals, the operation comprising:
   digitalizing audio signals having limited frequency bands, at a sampling frequency which is greater than two times as large as the maximum frequency component of the audio signal;
   detecting a clipping event of the audio signals, based on magnitudes of spectrum in a bandwidth which is greater than or equal to the limited frequency band;
   dividing the digitalized audio signals into plural frames; and
   obtaining, for each frame, spectra by a Fast Fourier Transform,
   wherein the detection of a clipping event comprises detecting, for each frame, a clipping event of the audio signals, and a clipping event data set is constructed by combining one or more detected clipping events, a level of the clipping events varying over time responsive to a power level of the audio signal input, and
   wherein clipping occurs at a level between the maximum frequency component and half of the sampling frequency.

9. The system according to claim 8, wherein the sampling frequency is greater than or equal to three times as large as the maximum frequency component of the audio signal.

10. The system according to claim 8, wherein the detection of a clipping event comprises determining whether or not a sum or average of the magnitudes of spectrum at the bandwidth which is greater than or equal to the limited frequency band is larger than a predetermined threshold.

11. The system according to claim 8, wherein the detection of a clipping event comprises determining, for each frame, whether or not a sum or average of the magnitudes of spectrum at the bandwidth which is greater than or equal to the limited frequency band is larger than a predetermined threshold.

12. The system according to claim 11, wherein the detection of a clipping event comprises determining that the frame which is a subject of the determination comprises a clipping event, if the determination is positive.

13. The system according to claim 8, wherein the system is a speech recognition system.

14. A computer program product for detecting a clipping event in audio signals, the computer program product comprising a computer readable storage medium having program instructions embodied therewith, wherein the computer readable storage medium is not a transitory signal per se, the program instructions executable by a computer to cause the computer to perform a method comprising:
   digitalizing audio signals having limited frequency bands, at a sampling frequency which is greater than two times as large as the maximum frequency component of the audio signal;
   detecting a clipping event of the audio signals, based on magnitudes of spectrum in a bandwidth which is greater than or equal to the limited frequency band;
   dividing the digitalized audio signals into plural frames; and obtaining, for each frame, spectra by a Fast Fourier Transform, wherein the detection of a clipping event comprises detecting, for each frame, a clipping event of the audio signals, and a clipping event data set is constructed by combining one or more detected clipping events, a level of the clipping events varying over time responsive to a power level of the audio signal input, and wherein clipping occurs at a level between the maximum frequency component and half of the sampling frequency.

15. The computer program product according to claim 14, wherein the sampling frequency is greater than or equal to three times as large as the maximum frequency component of the audio signal.

16. The computer program product according to claim 14, wherein the detection of a clipping event comprises determining whether or not a sum or average of the magnitudes of spectrum at the bandwidth which is greater than or equal to the limited frequency band is larger than a predetermined threshold.

17. The computer program product according to claim 15, wherein the detection of a clipping event comprises determining, for each frame, whether or not a sum or average of the magnitudes of spectrum at the bandwidth which is greater than or equal to the limited frequency band is larger than a predetermined threshold.

18. The computer program product according to claim 17, wherein the detection of a clipping event comprises determining that the frame which is a subject of the determination comprises a clipping event, if the determination is positive.

* * * * *